United States Patent
Hyun

(10) Patent No.: US 7,300,844 B2
(45) Date of Patent: Nov. 27, 2007

(54) METHOD OF FORMING GATE OF FLASH MEMORY DEVICE

(75) Inventor: Chan Sun Hyun, Icheon-si (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 11/490,304

(22) Filed: Jul. 20, 2006

(65) Prior Publication Data

US 2007/0134877 A1    Jun. 14, 2007

(30) Foreign Application Priority Data

Dec. 12, 2005    (KR) ..................... 10-2005-0121685

(51) Int. Cl.
*H01L 21/336* (2006.01)
(52) U.S. Cl. ................. 438/263; 438/257; 257/E29.304
(58) Field of Classification Search ................. 438/257, 438/258–260, 261–263, E21.179, E21.422, 438/E21.68–689; 257/314–321
See application file for complete search history.

(56) References Cited

U.S. PATENT DOCUMENTS

| 6,617,241 | B1 * | 9/2003 | Doan | .................. 438/626 |
| 7,183,205 | B2 * | 2/2007 | Hong | .................. 438/671 |

* cited by examiner

*Primary Examiner*—Akm Ullah
*Assistant Examiner*—Walter Swanson
(74) *Attorney, Agent, or Firm*—Marshall, Gerstein & Borun LLP

(57) ABSTRACT

A method of forming a gate of a flash memory device, including the steps of forming a tunnel oxide film and a first polysilicon layer in an active region of a semiconductor substrate, an isolation film in the field region, a dielectric layer, a second polysilicon layer, a metal silicide film, and a hard mask film on the structure, etching the hard mask film, the metal silicide film, and a given region of the second polysilicon layer to expose the dielectric layer, stripping a top surface of the exposed dielectric layer of the active region and the field region, a part of the first polysilicon layer of the active region to form dielectric layer horns, the first polysilicon layer and a part of the dielectric layer horns of the active region, and the first polysilicon layer and the dielectric layer horns of the active region.

9 Claims, 3 Drawing Sheets

METHOD OF FORMING GATE OF FLASH MEMORY DEVICE

BACKGROUND

1. Field of the Invention

The invention relates generally to a method of forming a flash memory device and, more particularly, to a method of forming a gate of a flash memory device, wherein the dielectric layer is etched by controlling the recipe during the gate etch process, thereby preventing attack occurring in the active region of the semiconductor substrate.

2. Discussion of Related Art

A flash memory device is a device fabricated by taking the advantages of EPROM having programming and erase characteristics and EEPROM having electrical programming erase characteristics. The flash memory device can realize a storage state of one bit using one transistor and can perform electrically programming and erase operations.

The flash memory cell generally has a vertical lamination type gate structure having a floating gate formed on a silicon substrate. A multi-layer gate structure typically includes one or more tunnel oxide films or dielectric layers, and a control gate formed on or near the floating gate.

The problems of the related art are described below while describing the gate formation method of the flash memory device in the related art.

A tunnel oxide film, a first polysilicon layer for a floating gate, and a nitride film are sequentially formed on a semiconductor substrate.

After a photoresist pattern is formed on the nitride film, the nitride film, the first polysilicon layer, the tunnel oxide film, and a part of the semiconductor substrate are etched using the photoresist pattern as a mask, forming trenches. A gap-fill process is then performed to form a field region and the nitride film is then stripped.

After a cleaning process is carried out, a dielectric layer, a second polysilicon layer for a control gate, a tungsten silicide film, and a hard mask film are formed.

The hard mask film, the tungsten silicide film, and the second polysilicon layer of the active region and the field region are sequentially etched by a gate etch process. The dielectric layer and a part of the gap-filled oxide film of the field region are etched at the same time when the dielectric layer and the first polysilicon layer of the active region are etched.

In this case, the gate etch process is performed in the same chamber called a "DPS poly chamber." The hard mask film, the tungsten silicide film, and the second polysilicon layer are etched until the dielectric layer is exposed using a high-selectivity recipe against oxide. The etch process of the dielectric layer is performed such that the dielectric layer and the first polysilicon layer have the same ratio using a recipe in which the etch ratio of oxide and polysilicon becomes 1:1.

However, top corners of the semiconductor substrate of the active region are also partially etched while the dielectric layer and a part of the gap-filled oxide film of the field region are etched during the process of etching the dielectric layer of the active region and the field region. Accordingly, there is a problem in that attack is generated at the top corners.

SUMMARY OF THE INVENTION

In one embodiment, the invention provides a method of forming a gate of a flash memory device, in which the dielectric layer is etched by controlling the recipe in multiple stages during the gate etch process, thereby preventing attack occurring at top corners of the semiconductor substrate.

In another embodiment, the invention provides a method of forming a gate of a flash memory device, in which additional spacer formation and etch processes for preventing attack are not required, thereby reducing process steps.

According to one aspect, the invention provides a method of forming a gate of a flash memory device, including the steps of (a) forming a tunnel oxide film and a first polysilicon layer in an active region of a semiconductor substrate in which the active region and a field region are defined, and forming an isolation film in the field region, (b) sequentially forming a dielectric layer, a second polysilicon layer, a conductive metal silicide film, and a hard mask film on the entire structure including the active region and the field region, (c) etching the hard mask film, the metal silicide film, and a predetermined region of the second polysilicon layer to expose the dielectric layer, (d) stripping a top surface of the exposed dielectric layer of the active region and the field region, (e) stripping a part of the first polysilicon layer of the active region to form dielectric layer horns, (f) stripping the first polysilicon layer and a part of the dielectric layer horns of the active region, and (g) completely stripping the first polysilicon layer and the dielectric layer horns of the active region.

The first polysilicon layer may preferably be formed to a thickness of 800 Å to 1200 Å.

In the step (d), after the top surface of the dielectric layer is stripped, the first polysilicon layer and the dielectric layer remaining on the sidewalls of the first polysilicon layer may preferably be etched to a thickness of about 100 Å to about 300 Å.

In the etch process, the first polysilicon layer and the dielectric layer may preferably be etched to a thickness of about 100 Å to 300 Å using $CH_4$ gas according to a recipe in which the etch rate of oxide and poly is set to 1:1.

Step (e) may preferably be performed using a mixed gas of HBr and He, a mixed gas of HBr and $O_2$, or a mixed gas of $Cl_2$ and $O_2$ so that the etch rate of polysilicon is high and the etch rate of oxide is relatively low.

In the step (f), the first polysilicon layer and a part of the dielectric layer horns may preferably be etched to a thickness of about 100 Å to about 300 Å using $CH_4$ gas according to a recipe in which the etch rate of oxide and polysilicon is set to 1:1.

The dielectric layer horns formed in the step (e) may preferably have a height about 200 Å to about 400 Å higher than that of the first polysilicon layer.

Step (g) may preferably be performed using a mixed gas of HBr and He, a mixed gas of HBr and $O_2$, or a mixed gas of $Cl_2$ and $O_2$ so that the etch rate of polysilicon is high and the etch rate of oxide is relatively low.

BRIEF DESCRIPTION OF THE DRAWINGS

A more compete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF EMBODIMENTS

The invention will now be described in detail in connection with certain exemplary embodiments with reference to the accompanying drawings.

Figure 1:
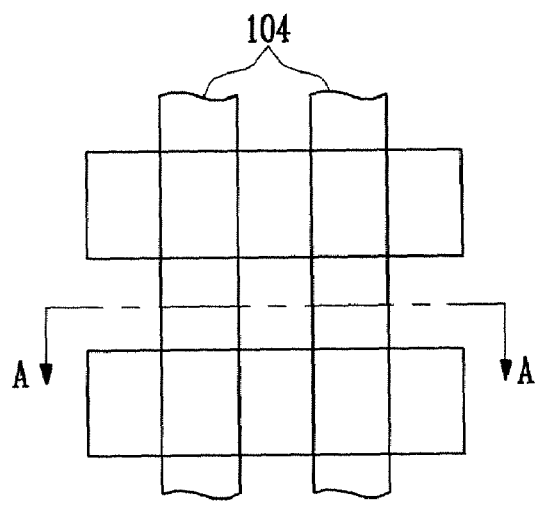
FIG. 1 is a plan view illustrating a part of a cell array region of a flash memory device according to an embodiment of the invention.

FIG. 1 is a plan view illustrating a part of a cell array region of a flash memory device according to an embodiment of the invention. FIGS. 2A to 2E are cross-sectional views illustrating a method of forming a gate of a flash memory device taken along line A-A of FIG. 1 according to an embodiment of the invention.

Figure 2A:
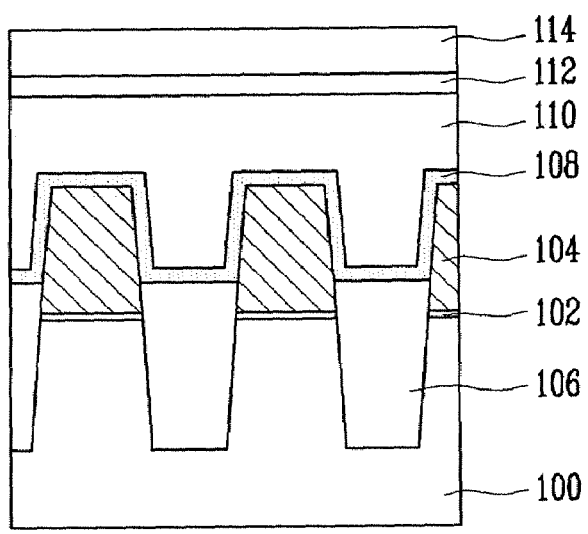
FIGS. 2A to 2F are cross-sectional views illustrating a method of forming a gate of a flash memory device taken along line A-A of FIG. 1 according to an embodiment of the invention.

Referring to FIGS. 1 and 2A, a tunnel oxide film 102, a first polysilicon layer 104 for a floating gate, and a nitride film (not shown) are sequentially formed on a semiconductor substrate 100. The first polysilicon layer 104 may preferably be formed to a thickness of 800 Å to 1200 Å.

A photoresist pattern (not shown) is formed on the nitride film. The nitride film (not shown), the first polysilicon layer 104, the tunnel oxide film 102, and a part of the semiconductor substrate 100 are sequentially etched using the photoresist pattern (not shown) as a mask, thereby forming trenches.

A gap-fill process using an oxide film 106 is performed to form a field region. After the nitride film (not shown) is stripped, chemical mechanical polishing (CMP) and a cleaning process are carried out in order to control the effective field oxide height (EFH). At this time, the thickness of the first polysilicon layer 104 is preferably kept to about 800 Å.

Figure 2B:
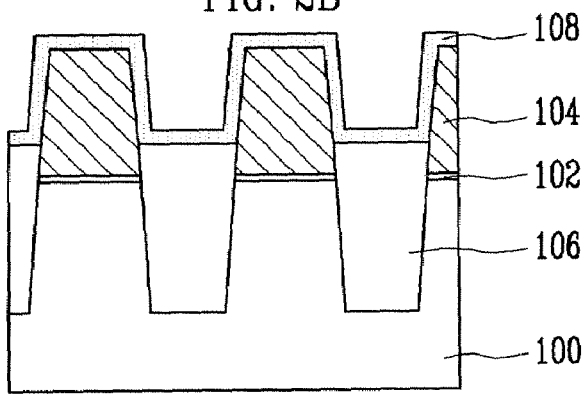

A dielectric layer 108, a second polysilicon layer for a control gate 110, a conductive metal (preferably and illustratively tungsten) silicide film 112, and a hard mask film 114 are sequentially formed on the entire structure. Referring to FIGS. 2A and 2B, a gate etch process of etching the hard mask film 114, the tungsten silicide film 112, and a part of the second polysilicon layer 110 is performed in the same chamber until the dielectric layer 108 is exposed.

Figure 2C:
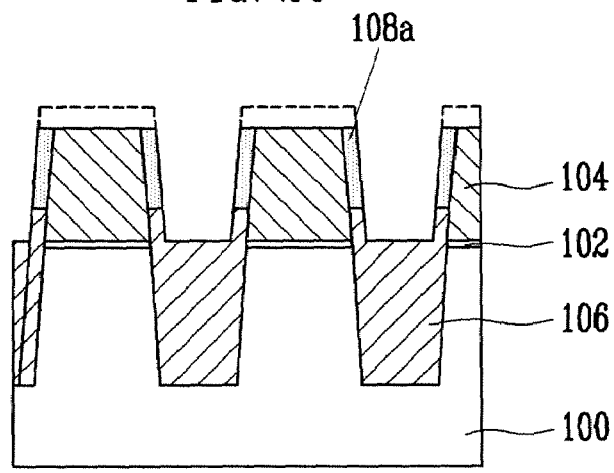

Referring to FIG. 2C, a first etch process of etching the dielectric layer 108 and the first polysilicon layer 104, of the gate etch process, is performed.

The first etch process is a process of etching the first polysilicon layer 104 and the dielectric layer 108 on the sidewalls of the first polysilicon layer 104 at the same time after the top surface of the dielectric layer 108 is stripped. The first etch process may be performed using $CH_4$ gas according to a recipe in which the etch rate of oxide and poly becomes 1:1. At this time, the first polysilicon layer 104 and the dielectric layer 108 of about 100 Å to about 300 Å are etched.

Figure 2D:
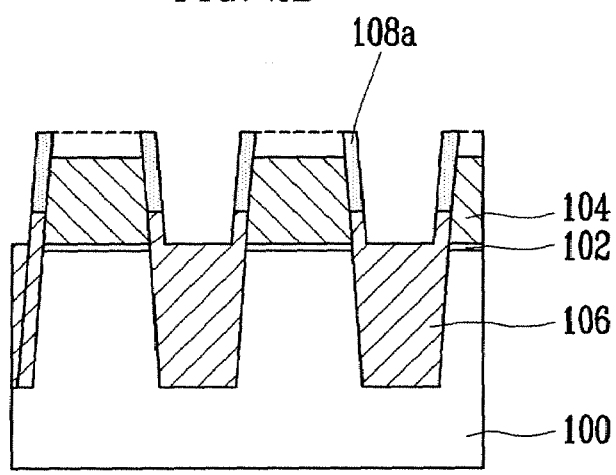

Referring to FIG. 2D, a second etch process of etching the first polysilicon layer 104 is performed.

The second etch process is preferably performed using a mixed gas of HBr and He, a mixed gas of HBr and $O_2$, or a mixed gas of $Cl_2$ and $O_2$ so that the etch rate of polysilicon is relatively high and the etch rate of oxide is relatively low.

Figure 2E:
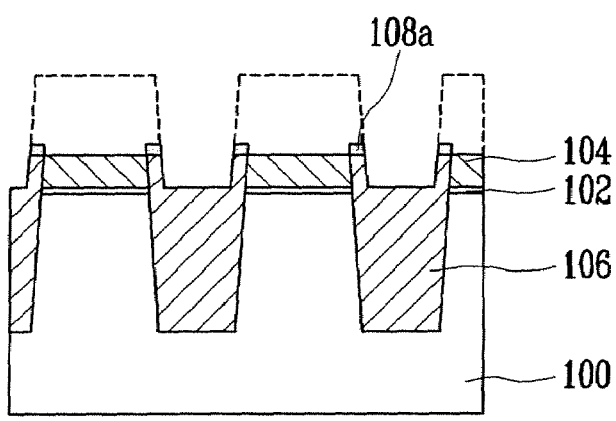

The first polysilicon layer 104 is etched to thickness of about 100 Å to about 300 Å, but the dielectric layer 108 remaining on the sidewalls of the first polysilicon layer 104 remains intact, thereby forming dielectric layer horns 108a. The dielectric layer horns 108a have a height, which is preferably about 200 Å to about 400 Å higher than that of the etched first polysilicon layer 104. Referring to FIG. 2E a third etch process of etching the dielectric layer horns 108a and the first polysilicon layer 104 is performed.

The third etch process is a process of etching the dielectric layer horns 108a and the first polysilicon layer 104 at the same time in the same manner as FIG. 2B. The third etch process is preferably performed using $CH_4$ gas according to a recipe in which the etch rate of oxide and poly becomes 1:1. At this time, the dielectric layer horns 108a and the first polysilicon layer 104 of about 100 Å to about 300 Å are etched so that a small amount of the dielectric layer horns 108a remains.

Figure 2F:
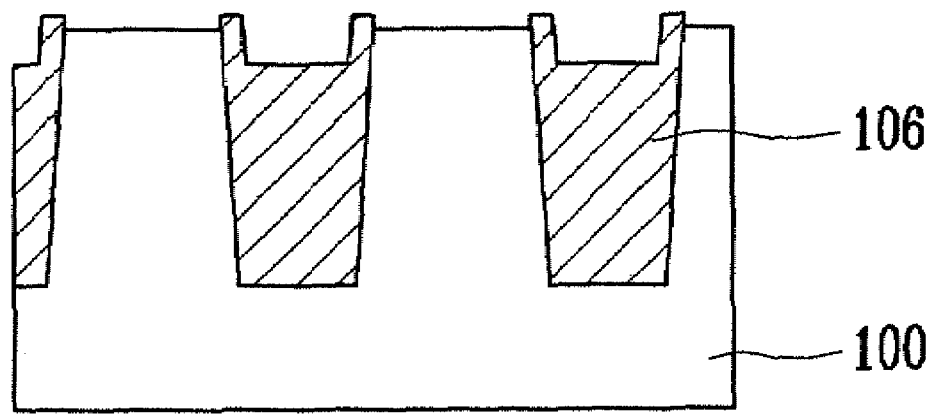

Referring to FIG. 2F, the remaining first polysilicon layer 104 is stripped, preferably using a mixed gas of HBr and He, a mixed gas of HBr and $O_2$ or a mixed gas of $Cl_2$ and $O_2$ so that the etch rate of polysilicon is high and the etch rate of oxide is relatively low. A fourth etch process of stripping the remaining dielectric layer horns 108a is also performed at the same time. A cleaning process is performed to strip the tunnel oxide film 102.

As described above, according to the invention, during the gate etch process of the dielectric layer, the dielectric layer is etched while controlling the recipe in multiple stages. It is therefore possible to prevent attack from occurring at the top corners of the semiconductor substrate of the active region.

Furthermore, additional spacer formation and etch processes for preventing attack are not required. Accordingly, process steps can be shortened.

While the invention has been described in connection with practical exemplary embodiments, the invention is not limited to the disclosed embodiments, but, on the contrary, is intended to cover various modifications and equivalent arrangements included within the spirit and scope of the appended claims.

What is claimed is:

1. A method of forming a gate of a flash memory device, the method comprising the steps of:
    (a) forming a tunnel oxide film and a first polysilicon layer in an active region of a semiconductor substrate in which the active region and a field region are defined, and forming an isolation film in the field region;
    (b) sequentially forming a dielectric layer, a second polysilicon layer, a conductive metal silicide film, and a hard mask film on the entire structure including the active region and the field region;

(c) etching the hard mask film, the metal silicide film, and a given region of the second polysilicon layer to expose the dielectric layer;
(d) stripping a top surface of the exposed dielectric layer of the active region and the field region;
(e) stripping a part of the first polysilicon layer of the active region to form dielectric layer horns;
(f) stripping the first polysilicon layer and a part of the dielectric layer horns of the active region; and
(g) completely stripping the first polysilicon layer and the dielectric layer horns of the active region.

2. The method of claim 1, comprising forming the first polysilicon layer to a thickness of about 800 Å to about 1200 Å.

3. The method of claim 1, comprising in step (d), after the top surface of the dielectric layer is stripped, etching the first polysilicon layer and the dielectric layer remaining on the sidewalls of the first polysilicon layer to a thickness of about 100 Å to about 300 Å.

4. The method of claim 3, comprising in the etch process, etching the first polysilicon layer and the dielectric layer to a thickness of about 100 Å to about 300 Å using $CH_4$ gas according to a recipe in which the etch rate of oxide and polysilicon is set to about 1:1.

5. The method of claim 1, comprising performing the step (e) using a mixed gas of HBr and He, a mixed gas of HBr and $O_2$, or a mixed gas of $Cl_2$ and $O_2$ so that the etch rate of polysilicon is relatively high and the etch rate of oxide is relatively low.

6. The method of claim 1, comprising in step (f), etching the first polysilicon layer and a part of the dielectric layer horns to a thickness of about 100 Å to about 300 Å using $CH_4$ gas according to a recipe in which the etch rate of oxide and polysilicon is set to about 1:1.

7. The method of claim 1, wherein the dielectric layer horns formed in the step (e) have a height of about 200 Å to about 400 Å higher than the height of the first polysilicon layer.

8. The method of claim 1, comprising performing the step (g) using a mixed gas of HBr and He, a mixed gas of HBr and $O_2$, or a mixed gas of $Cl_2$ and $O_2$ so that the etch rate of polysilicon is relatively high and the etch rate of oxide is relatively low.

9. The method of claim 1, wherein the conductive metal silicide is tungsten silicide.

* * * * *